US008965572B2

(12) United States Patent
Ohkubo et al.

(10) Patent No.: US 8,965,572 B2
(45) Date of Patent: Feb. 24, 2015

(54) FRAME FEEDING SYSTEM AND FRAME FEEDING METHOD

(75) Inventors: Tatsuyuki Ohkubo, Kumagaya (JP); Mitsuo Yoda, Kumagaya (JP)

(73) Assignee: Hitachi High-Tech Instruments Co., Ltd., Kumagaya-shi (JP)

( * ) Notice: Subject to any disclaimer, the term of this patent is extended or adjusted under 35 U.S.C. 154(b) by 729 days.

(21) Appl. No.: 13/224,789

(22) Filed: Sep. 2, 2011

(65) Prior Publication Data

US 2013/0017040 A1  Jan. 17, 2013

(30) Foreign Application Priority Data

Jul. 15, 2011  (JP) ................................ 2011-156680

(51) Int. Cl.
*B25J 9/00* (2006.01)
*H01L 21/67* (2006.01)
*H01L 21/677* (2006.01)
*H01L 23/00* (2006.01)

(52) U.S. Cl.
CPC .... *H01L 21/67259* (2013.01); *H01L 21/67265* (2013.01); *Y10S 414/141* (2013.01); *Y10S 414/135* (2013.01); *Y10S 414/137* (2013.01); *H01L 2224/7865* (2013.01); *H01L 24/75* (2013.01); *H01L 24/78* (2013.01); *H01L 2224/75251* (2013.01); *H01L 2224/7565* (2013.01); *H01L 2224/759* (2013.01); *H01L 2224/78251* (2013.01); *H01L 2224/789* (2013.01); *H01L 21/67778* (2013.01); *H01L 2924/00014* (2013.01)
USPC ................. 700/253; 414/222.02; 414/225.01; 414/416.07; 414/937; 414/941; 700/121; 700/222; 700/229; 700/258; 414/935

(58) Field of Classification Search
CPC .................... H01L 21/67259; H01L 21/67265
USPC .................. 414/222.02, 225.01, 217, 416.07, 414/416.08, 937, 941; 700/121, 222, 229, 700/253, 258
See application file for complete search history.

(56) References Cited

U.S. PATENT DOCUMENTS

| 4,683,644 | A | * | 8/1987 | Tange et al. ..................... 29/703 |
| 5,897,290 | A |   | 4/1999 | Lu et al. |
| 5,903,463 | A | * | 5/1999 | Seguro et al. ................. 700/214 |
| 6,045,318 | A |   | 4/2000 | Mochida et al. |

(Continued)

FOREIGN PATENT DOCUMENTS

| JP | 01239944 A | * | 9/1989 | |
| JP | 5-67670 A |   | 3/1993 | |
| KR | 100277195 B1 | * | 7/2000 | ............. H01L 21/68 |

OTHER PUBLICATIONS

Chinese Office Action dated Sep. 3, 2014 (eight (8) pages).

*Primary Examiner* — Scott Lowe
(74) *Attorney, Agent, or Firm* — Crowell & Moring LLP

(57) ABSTRACT

In recent years, frames have gotten larger in size and thinner, and warping of the frames has posed a problem. If a warp of a frame is large, there is a high possibility that fetching the frame may fail. If fetching the frame fails, that is, if the frame cannot be fetched, the lead time of mounting gets longer. Further, the frame that cannot be fetched has to be manually removed by an operator. Therefore, a man-hour increases. According to the present invention, before a loader feeder fetches a frame from a frame magazine, a loader lifter is moved in a Y direction. Thereafter, the loader feeder fetches the frame from the frame magazine.

8 Claims, 9 Drawing Sheets

(56) References Cited

U.S. PATENT DOCUMENTS

| | | | |
|---|---|---|---|
| 6,869,263 B2 * | 3/2005 | Gilchrist | 414/217 |
| 2004/0013500 A1 | 1/2004 | Gilchrist | |
| 2008/0267747 A1 * | 10/2008 | DiBella et al. | 414/225.01 |

* cited by examiner

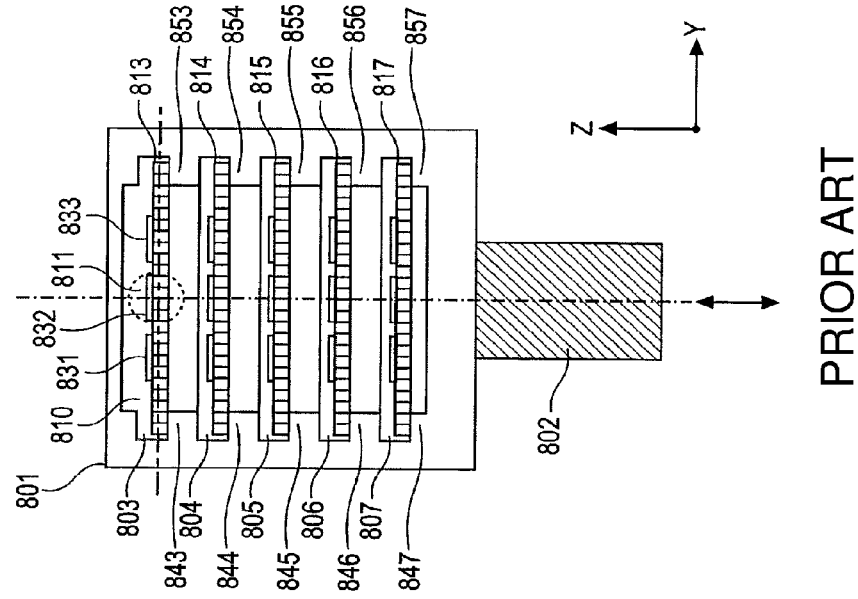
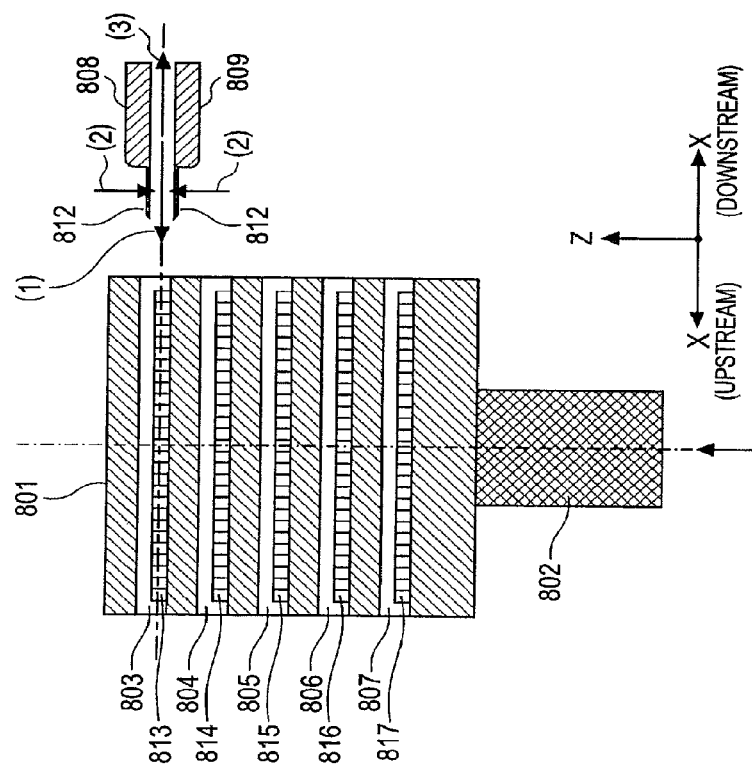

FRAME FEEDING SYSTEM AND FRAME FEEDING METHOD

BACKGROUND OF THE INVENTION (1) Field of the Invention

The present invention relates to a component mounting system such as a die bonder, or more particularly, to a frame feeding technology for fetching a frame from a frame cassette.

(2) Description of the Related Art

In a component mounting system such as a die bonding system (die bonder), a frame feeding system fetches a frame, on which one mount area or plural mount areas are formed, from a frame magazine one by one, and carries it to a work area. The component mounting system performs component attachment work such as die bonding, wire bonding, or bump bonding on the mount areas on the frame carried to the work area.

As mentioned above, for the component mounting system, the frame feeding system that fetches a frame from the frame magazine is needed.

FIG. 8A and FIG. 8B are diagrams showing an example of a conventional frame feeding system that fetches a frame stored in a frame magazine. In FIG. 8A and FIG. 8B, there are shown a frame magazine 801, a magazine lifter 802 that elevates or drives the frame magazine 801 (moves the frame magazine up and down (in Z-axis directions) at predetermined intervals), frame storage chambers 803 to 807, an upper part 808 of a loader feeder, claws 812 of the upper part 808 and a lower part 809, and the lower part 809 of the loader feeder. Also shown are a storage chamber unit 810 of the frame magazine 801, mount areas 831 to 833 formed on a frame, and frames 813, 814, 815, 816, and 817 each of which has the mount areas 831 to 833 formed thereon and which are stored in the frame storage chambers 803, 804, 805, 806, and 807 respectively. A circle 811 indicates part of the frame which the claws 812 clamps after being inserted into the frame storage chamber 803 of the frame magazine 801 in order to fetch the frame 813. Further, there are shown projections 843 and 853, 844 and 854, 846 and 856, and 847 and 857 each pair of which bears the frame 813, 814, 815, 816, or 817. The frames 813 to 817 are stored equidistantly at a loading pitch P that is a spacing in a height (Z) direction between adjoining ones of the frame storage chambers.

FIG. 8A is a cross-sectional diagram in which the frame magazine 801 is seen in a Y direction, and FIG. 8B is a diagram in which the frame magazine 801 is seen from a downstream X direction.

Referring to FIG. 8A and FIG. 8B, a conventional manner in which the frame feeding system feeds the frame 813 stored in the frame magazine 801 will be described below.

In FIG. 8A and FIG. 8B, one frame having mount areas formed thereon is stored in each of the frame storage chambers 803 to 807 of the frame magazine 801. In the storage chamber unit 810, as shown in FIG. 8B, the projections 843 to 847 and 853 to 857 are formed as partitions on the left and right sides (in the Y directions), and the center parts of the frame storage chambers 803 to 807 are spatially integrated into one. Therefore, the frames 813 to 817 are borne by the projections 843 to 847 and 853 to 857 respectively on the left and right sides in the respective frame storage chambers 803 to 807, and stored equidistantly. For convenience' sake, only a portion of the loader feeder that clamps the frame 813 and takes it out of the frame magazine 801 (the upper part 803, lower part 809, and claws 812) is shown, but a portion thereof that carries the frame, which a main feeder has delivered into a work area, is not shown.

A description will be made of a case where the magazine lifter 802 of the frame feeding system falls or moves downward (downward in a Z-axis direction), and lies at a height at which the frame 813 on the uppermost stage of the frame magazine 801 can be fetched.

The upper part 808 and lower part 809 of the loader feeder are moved in an arrow (1) direction (an upstream X-axis direction) so that the claws 812 can be advanced into an entrance part of the frame storage chamber 803. Thereafter, the upper and lower claws 812 are closed in arrow (2) directions (Z-axis directions) in order to clamp the frame 813. The loader feeder having the upper part 808, lower part 809, and claws 812 is moved in an arrow (3) direction (downstream X-axis direction) with the claws 812, which clamp the frame 813, held closed. Thus, the loader feeder takes the frame 813 out of the frame magazine 801, and carries it to a guide rail that is not shown.

At this time, as shown in FIG. 8B, since the frame magazine 801 has the projections 843 and 853 on the sides thereof, the claws 812 cannot advance to the left or right edge of the frame 813 and cannot clamp the left or right edge thereof. Therefore, the claws 812 have to advance to the center of the frame 813 (for example, the part indicated with the circle 811) so as to clamp and take out the frame 813.

However, the center of the frame 813 has the mount areas 831 to 833 formed thereon. Therefore, when the claws 812 are advanced to the frame storage chamber 803, the claws 82 come into contact with the mount area 831, 832, or 833. There is a fear that the mount area brought into contact with the claws may be damaged.

Therefore, it is necessary to largely reduce the sideways width in Y-axis directions of at least the claw 812 of the upper part 801. However, when the sideways width of the claw 812 is reduced, the frequency of a failure in fetching a frame or the frequency of a positional deviation of the fetched frame 813 increases.

Referring to FIG. 9, a conventional frame feeding method will be described below. FIG. 9 is a flowchart for use in explaining an example of an acting procedure in accordance with the conventional frame feeding method which is followed by a control unit of a die bonder.

At step S901, a loader magazine Z-axis motor (not shown) is controlled in order to move the frame magazine 801 so that a designated stage of the frame magazine can be aligned with the loader feeder (for example, the frame storage chamber 803 on the uppermost stage in FIG. 8A and FIG. 8B). The frame magazine 801 is then stopped.

At step S902, a loader feeder motor (not shown) is controlled in order to move the claws 812 of the loader feeder to the frame storage chamber 803 of the frame magazine 801.

At step S903, a loader feeder opening/closing electromagnetic valve (not shown) is controlled in order to close the claws 812 of the loader feeder so that the claws can clamp the frame 813.

At step S904, the loader feeder motor (not shown) is controlled in order to take out the frame 813 with the claws 812 of the loader feeder.

At step S905, a frame detection sensor (not shown) is used to detect presence or absence of the frame 813.

At step S906, if a decision is made based on the result of the detection by the frame detection sensor that the frame 813 is absent (Yes), the procedure proceeds to step S908. If a decision is made that the frame 813 is present (No), the procedure proceeds to step S907.

At step S907, the frame 813 is moved to a preformation stage.

At step S908, a buzzer and a revolving indicator such as a Patlite (registered trademark) are controlled in order to output information signifying that frame fetching has failed to cause an error.

SUMMARY OF THE INVENTION

As mentioned above, in the conventional frame feeding system, there is a fear that any of the mount areas may be damaged. When an attempt is made to address the problem, the frequency of a failure in frame fetching or the frequency of a positional deviation of a fetched frame increases. In addition, since the thickness of frames has decreased in recent years, an event that a frame cannot be fetched from the frame magazine has occurred frequently. Eventually, a lead time for a component mounting system gets longer.

Japanese Patent Application Laid-Open Publication No. 05-67670 has disclosed a movement control technology to be applied to a case where a wafer ring stored in a wafer cassette is fed to a die bonding system. Even if the waver cassette is replaced with a frame cassette, the problem with which the aforesaid frame feeding system is confronted cannot be solved.

The present invention addresses the foregoing problems. An object of the present invention is to provide a frame feeding system and frame feeding method that do not cause a failure in frame fetching or a positional deviation of a fetched frame, and that ensures a short lead time.

According to a first aspect of the present invention, there is provided a frame feeding system including at least a loader lifter having an elevating drive that elevates or drives a frame magazine, which accommodates frames, in Z directions, a loader feeder that fetches a frame from the frame magazine, a main feeder that carries the frame fetched by the loader feeder to a work area, and a control unit that controls the loader lifter, loader feeder, and main feeder. The loader lifter further includes a first moving mechanism that moves the frame magazine a predetermined first distance in Y directions. The control unit controls the first moving mechanism of the loader lifter so as to move the frame magazine the first distance in the Y direction. Thereafter, the control unit controls the loader feeder so as to clamp a frame with the claws of the loader feeder and fetch the frame. Thereafter, the control unit controls the main feeder so as to carry the frame into the work area.

According to a second aspect of the present invention, in the frame feeding system in accordance with the first aspect of the present invention, the loader lifter further includes a second moving mechanism that moves the frame magazine a predetermined second distance up and down in the Z directions. The control unit includes a frame detection instrument that detects presence or absence of a frame. The control unit controls the loader feeder so as to clamp a frame with the claws of the loader feeder. Thereafter, the frame detection instrument detects presence or absence of the frame. If the frame is not detected, the control unit controls the second moving mechanism of the loader lifter so as to move the frame magazine the second distance up and down in the Z directions. Thereafter, the control unit controls the loader feeder so as to clamp the frame with the claws of the loader feeder and take out the frame.

According to a third aspect of the present invention, in order to address the problems, there is provided a frame feeding system including at least a loader lifter that has an elevating drive which elevates or drives a frame magazine, which accommodates frames, in Z directions, a loader feeder that fetches a frame from the frame magazine, a main feeder that carries the frame fetched by the loader feeder to a work area, and a control unit that controls the loader lifter, loader feeder, and main feeder. The loader lifter further includes a first moving mechanism that moves the frame magazine a predetermined first distance in Y directions, and a second moving mechanism that moves the frame magazine a predetermined second distance up and down in the Z directions. The control unit controls the first moving mechanism of the loader lifter so as to move the frame magazine the first distance in the Y direction. The control unit then controls the second moving mechanism of the loader lifter so as to move the frame magazine the second distance up and down in the Z directions. The control unit then controls the loader feeder so as to clamp a frame with the claws of the loader feeder and take out the frame.

According to a fourth aspect of the present invention, in either of the frame feeding systems in accordance with the second and third aspects of the present invention, the second moving mechanism repeats the up-and-down movement of the second distance plural times.

According to a fifth aspect of the present invention, in order to address the problems, there is provided a frame feeding method for a frame feeding system including at least a loader lifter that has an elevating drive which elevates or drives a frame magazine, which accommodates frames, in Z directions, a loader feeder that fetches a frame from the frame magazine, a main feeder that carries the frame fetched by the loader feeder to a work area, and a control unit that controls the loader lifter, loader feeder, and main feeder. The frame feeding method includes a first moving step of moving the frame magazine a predetermined first distance in a Y direction, a step of clamping a frame with the claws of the loader feeder, a step of taking out the frame, and a step of carrying the frame to the work area.

According to a sixth aspect of the present invention, the frame feeding method in accordance with the fifth aspect of the present invention further includes a frame detection step of detecting presence or absence of a frame that succeeds the first moving step. The frame feeding method further includes a second moving step at which if the frame is not detected at the frame detection step, the frame magazine is moved a predetermined second distance up and down in the Z directions.

According to a seventh aspect of the present invention, in order to solve the aforesaid problems, there is provided a frame feeding method for a frame feeding system including at least a loader lifter that has an elevating drive which elevates or drives a frame magazine, which accommodates frames, in Z directions, a loader feeder that fetches a frame from the frame magazine, a main feeder that carries the frame fetched by the loader feeder to a work area, and a control unit that controls the loader lifter, loader feeder, and main feeder. The frame feeding method includes a first moving step of moving the frame magazine a predetermined first distance in a Y direction, a second moving step of moving the frame magazine a predetermined second distance up and down in the Z directions, a step of clamping a frame with the claws of the loader feeder, a step of taking out the frame, and a step of carrying the frame to the work area.

According to an eighth aspect of the present invention, in either of the frame feeding methods in accordance with the sixth and seventh aspects of the present invention, at the second moving step, the up-and-down movement is repeated plural times.

According to the aspects of the present invention that addresses the problems, neither a failure in frame fetching nor a positional deviation of a fetched frame occurs. Further, a frame feeding system and frame feeding method capable of ensuring a short lead time can be realized.

BRIEF DESCRIPTION OF THE DRAWINGS

FIG. 8A is a cross-sectional diagram which shows an embodiment of a conventional frame feeding system that fetches a frame stored in a frame magazine and in which the frame magazine is seen in a Y direction;

FIG. 8B is a diagram which shows an embodiment of the conventional frame feeding system that fetches a frame stored in the frame magazine and in which the frame magazine is seen from a downstream side in an X direction.

DETAILED DESCRIPTION OF THE EMBODIMENT

Figure 1:
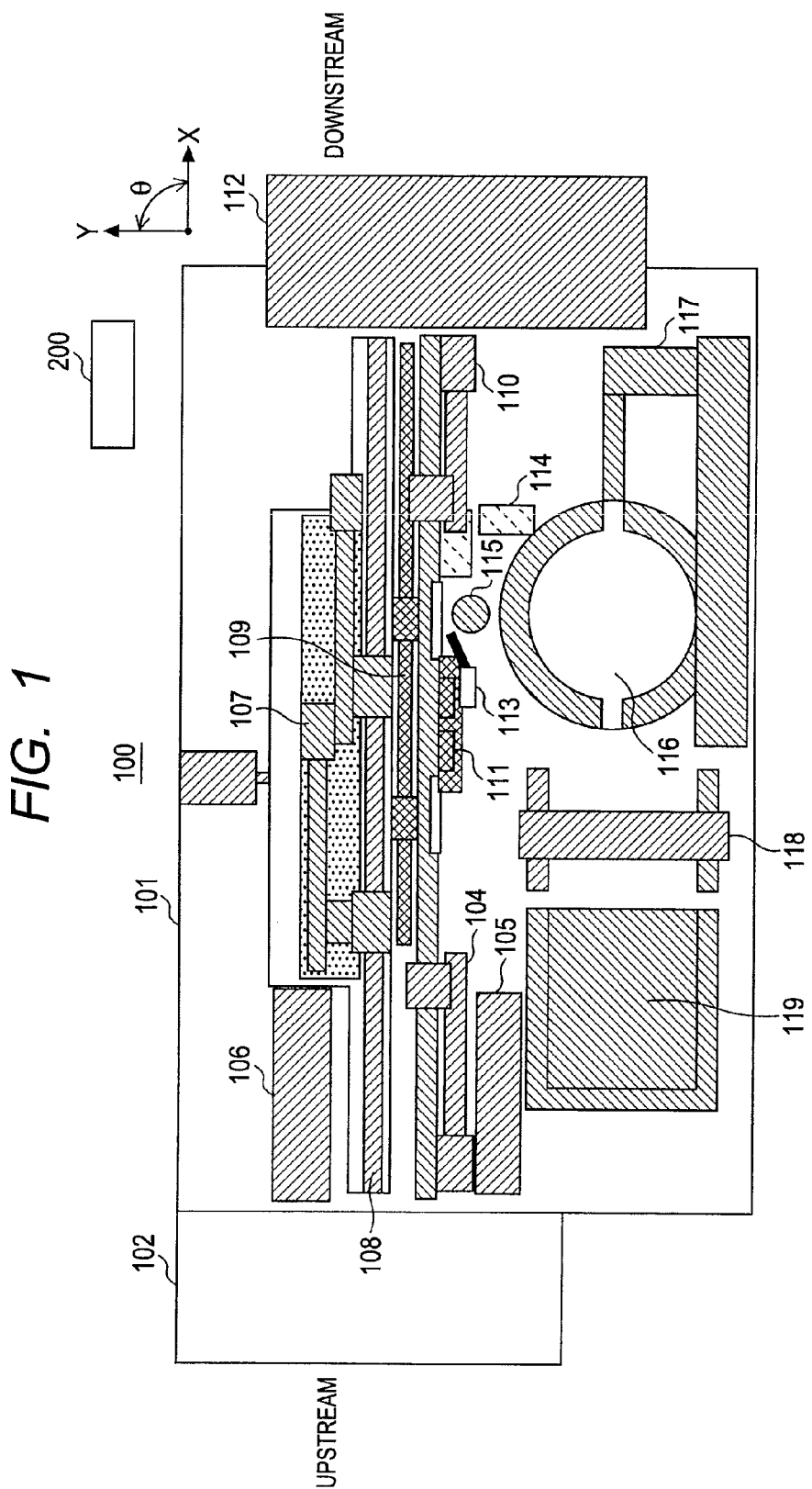
FIG. 1 is a block diagram showing a construction of an embodiment of a die bonder including a frame feeding system in accordance with the present invention.

An embodiment of the present invention will be described below in conjunction with the drawings and others.

Incidentally, a description will be made of the embodiment of the present invention but will not be intended to limit the scope of the present invention. A person with ordinary skill in the art can adopt embodiments having any or all of the elements replaced with equivalents, and the embodiments shall be encompassed in the present invention.

In descriptions to be made in conjunction with the respective drawings, the same reference numerals are assigned to components sharing the same capabilities. An iterative description will be avoided to the greatest possible extent.

Referring to the appended drawings, the construction of an example of a component mounting system in which a frame feeding system and frame feeding method in accordance with the present invention is employed will be described below. FIG. 1 is a block diagram showing the construction of an example of a die bonder including the frame feeding system in accordance with the present invention. In FIG. 1, there are shown a die bonder 100, a station 101 of the die bonder 100, a magazine loader 102 that carries a frame magazine (not shown) which accommodates frames, a loader feeder 104 that fetches a frame in a downstream direction on the station 101, a loader lifter 105 that drives the frame magazine, which accommodates frames, in up-and-down directions, an interlayer paper discharge box 106 into which interlayer paper peeled off from a frame is discharged, and a main feeder 107 that thrusts the frame fetched by the loader feeder 104 into a preformation stage in a die bonding work area. Also shown are a guide rail 108 along which the frame is guided in a straight direction of the main feeder 107, a stage heater 109 that heats the frame, an unloader feeder 110 that delivers the frame, on which die pellets are mounted, in a downstream direction from the station 101, a frame presser 111 that immobilizes the frame during die bonding work, a magazine unloader 112 that delivers the frame to the frame magazine, an ion blower 113 that sprays negative ions, which are used to remove static electricity, to a wafer, a bar code reader 114 that reads a bar code inscribed in a wafer ring, a die upthrust unit 115 that upthrusts the die pellets from the wafer of the wafer ring (not shown), a wafer ring holder 116 that holds the wafer ring, a wafer extractor 117, a wafer correction chute 118, a wafer cassette unit 119, and a control unit 200.

The die bonder 100 shown in FIG. 1 operates under the control of the control unit 200. A frame feeding system includes at least the loader feeder 104, loader lifter 105, main feeder 107, and control unit 200. Similarly to the die bonder 100, the frame feeding system is controlled by the control unit 200 (for details of the control unit, see FIG. 2).

In a frame magazine placed in the magazine loader 102, frames that are members to be mounted are stored. Likewise, in a frame magazine placed in the magazine unloader 112, frames on which die pellets are mounted by the die bonder are stored. The wafer extractor 117 fetches a wafer ring from a wafer cassette placed in the wafer cassette unit 119, and carries the wafer ring to the wafer ring holder 116. In the wafer cassette unit 119, the wafer cassette in which wafer rings are stored on plural stages so that they can be unloaded is placed.

FIG. 1 is a plan view in which the die bonder 100 is seen from above. X directions includes an upstream (leftward in the sheet of paper) direction and downstream direction (rightward in the sheet of paper). A frame that is a member to be mounted is carried from upstream to downstream in the X direction, and subjected to die bonding.

In the die bonder shown in FIG. 1, frames stored in the frame magazine placed in the magazine loader 102 are fetched from the frame magazine by the frame feeding system. The frame feeding system carries a fetched frame to the preformation stage in the work area. Interlayer paper is peeled off from each of mount areas formed on the carried frame, and an adhesive is applied to the mount areas. The frame is then delivered to a die attachment stage in the work area.

On the die attachment stage, a bonding head that is interlocked with the die upthrust unit 115 adsorbs a pellet from the wafer ring holder 116, and bonds a die to a predetermined position on the frame.

Figure 2:
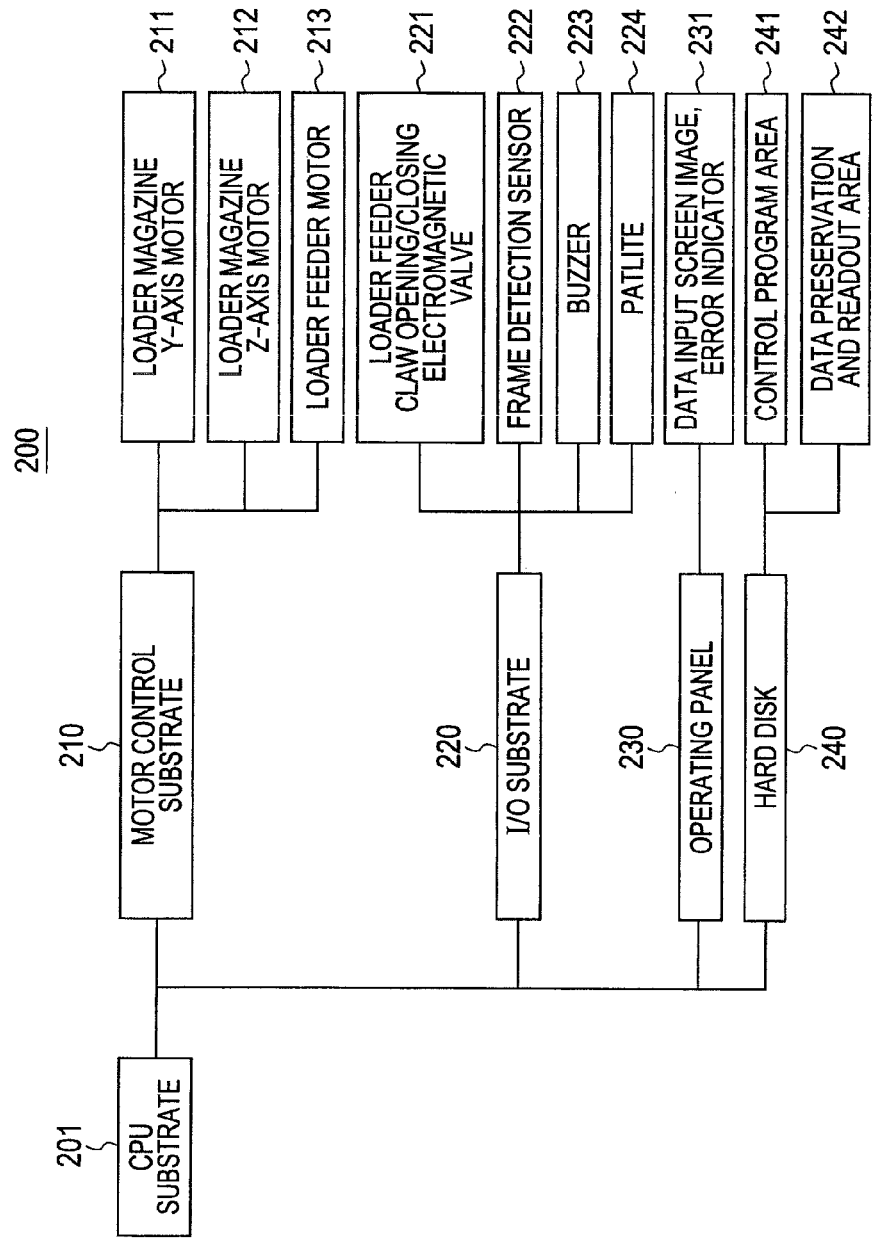
FIG. 2 is a block diagram for use in explaining an embodiment of the configuration of a control unit 200 of the frame feeding system in accordance with the present invention.

FIG. 2 is a block diagram for use in explaining an example of the configuration of the control unit 200 of the frame feeding system of the present invention. In FIG. 2, there are shown the control unit 200, a central processing unit (CPU) substrate 201, a motor control substrate 210, an input/output (I/O) substrate 220, an operating panel 230, and a hard disk 240. The CPU substrate 201 controls the motor control substrate 210, I/O substrate 220, operating panel 230, and hard disk 240.

The motor control substrate 210 controls a loader magazine Y-axis motor 211. In addition, the motor control substrate 210 controls a loader magazine Z-axis motor 212. In addition, the motor control substrate 210 controls a loader feeder motor 213.

Further, the I/O substrate 220 handles an opening/closing electromagnetic valve 221 so as to control claws 808-1 and 809-1 of the loader feeder 104, and thus controls opening and closing of the claws 801-1 and 809-1 of the loader feeder 104. In addition, the I/O substrate 220 controls a frame detection sensor 222 that detects presence or absence of a frame, a buzzer 223, and a revolving indicator 224. Specifically, the frame detection sensor 222 acquires information on detected presence or absence of a frame. If a decision is made that a frame is absent at predetermined feeding timing, the I/O substrate 220 controls the buzzer 223 and revolving indicator 224 so as to output a buzzer sound and light a Patlite.

Further, the operating panel 230 controls a display unit 231, which is not shown, of the die bonder 100 so as to display a data input screen image, in which an error is indicated, or an error indicator on the display unit 231.

Further, the hard disk 440 controls a control program area 241 in which control programs for the die bonder 100 and frame feeding system are preserved, and a data preservation and readout area 242 in or from which data is preserved or read.

Figure 3:
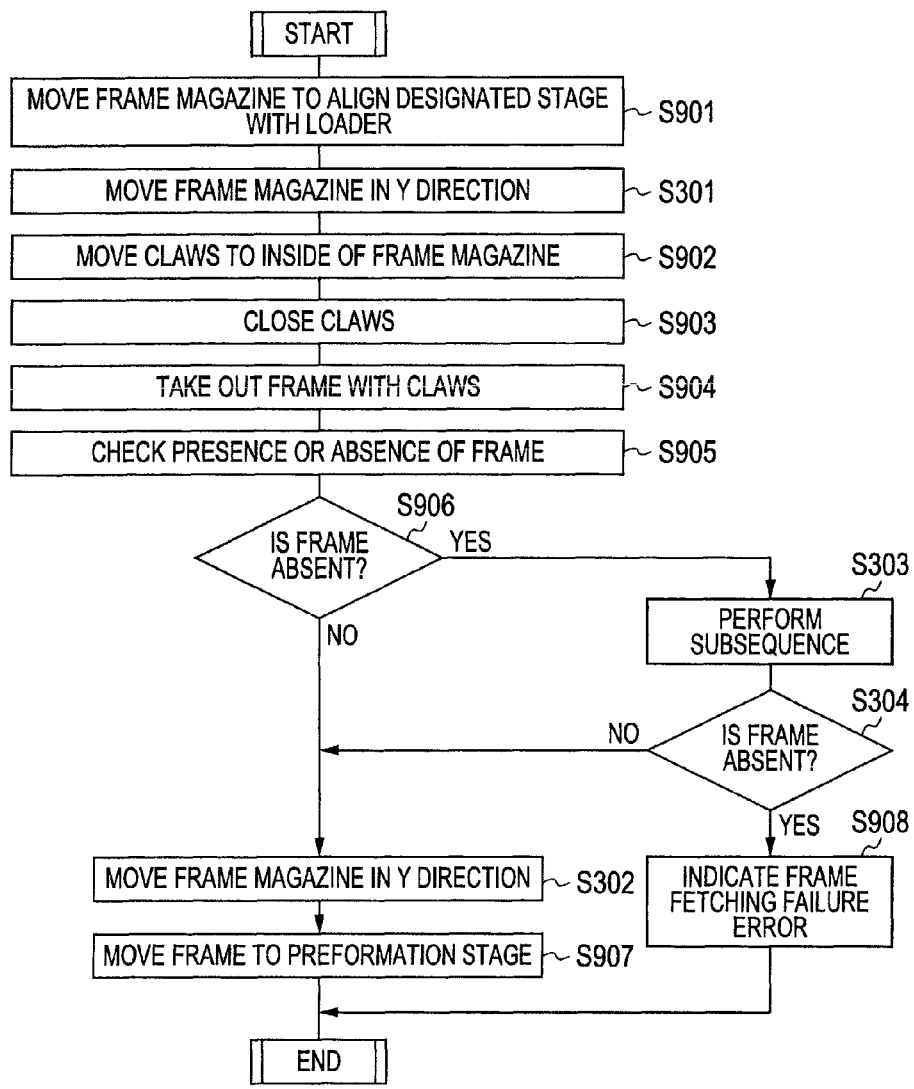
FIG. 3 is a flowchart describing an embodiment of an acting procedure in accordance with a frame feeding method of the present invention which is followed by a control unit of the die bonder.
Figure 4:
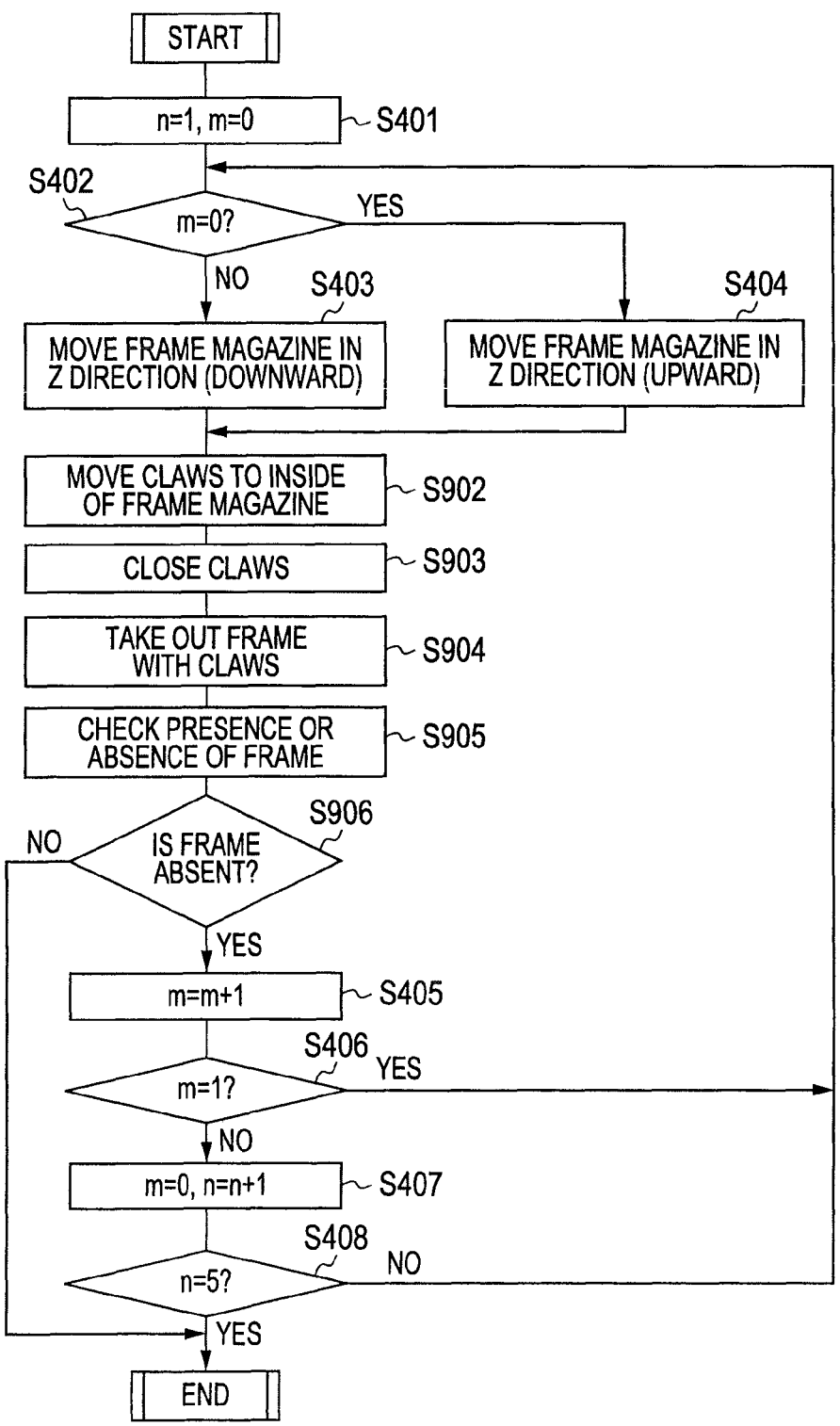
FIG. 4 is a flowchart for use in explaining processing actions of a subsequence (step S303) to be executed as mentioned in FIG. 3.
Figure 9:
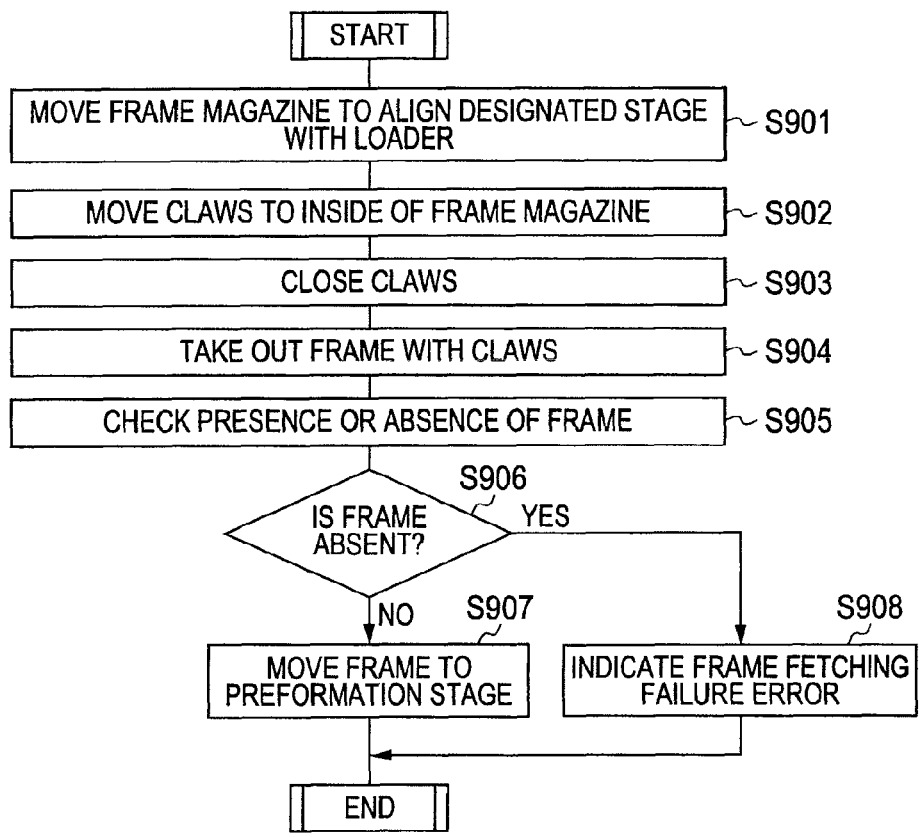
FIG. 9 is a flowchart for use in explaining an embodiment of an acting procedure in accordance with a conventional frame feeding method which is followed by the control unit of the die bonder.

Next, referring to FIG. 3 and FIG. 4, an embodiment of a frame feeding method in accordance with the present invention will be described below. FIG. 3 is a flowchart for use in explaining an example of an acting procedure in accordance with the frame feeding method of the present invention which is followed by the control unit of the die bonder. In the flowchart of FIG. 3, the same reference numerals are assigned to steps at which the same actions as those mentioned in the flowchart of FIG. 9 are performed. FIG. 4 is a flowchart for use in explaining processing actions of a subsequence (step S303) executed as mentioned in FIG. 3.

At step S901, the loader magazine Z-axis motor is controlled in order to move the frame magazine 801 so that a designated stage of the frame magazine (for example, the frame storage chamber 803 on the uppermost stage) can be aligned with the loader feeder.

At step S301, the loader magazine Y-axis motor is controlled in order to move the frame magazine 801 in a Y direction (for example, 2 to 3 mm backward).

The actions at steps S902 to S905 are identical to those mentioned in FIG. 9. An iterative description will be omitted.

At step S906, if a decision is made based on a result of detection by the frame detection sensor that the frame 813 is absent (Yes), the procedure proceeds to step S303. If a decision is made that the frame 813 is present (No), the procedure proceeds to step S302.

At step S303, the loader magazine 802 is moved in a Y direction and thus returned to an original position at which the loader magazine is located prior to the processing of step S301.

At step S907, the frame 813 is moved to the preformation stage.

At step S303, a subsequence is executed (see FIG. 4).

At step S304, if a decision is made based on a result of detection by the frame detection sensor that the frame 813 is absent (Yes), the procedure proceeds to step S908. If a decision is made that the frame 813 is present (No), the procedure proceeds to step S302.

At step S908, the buzzer and Patlite (registered trademark) are controlled in order to output information signifying that frame fetching has failed to cause an error.

During the subsequence at step S303, first, at step S401 in the flowchart of FIG. 4, parameters n and m are initialized (n=1 and m=0).

At step S402, whether the parameter m takes on 0 is decided. If the parameter m takes on 0 (m=0), the procedure proceeds to step S404. If the parameter m takes on any value other than 0 (m≠0), the procedure proceeds to step S403.

At step S403, the loader magazine Z-axis motor is controlled in order to move the frame magazine 801 an n multiple of a predetermined distance in the downward Z direction (for example, (0.1×n) mm downward).

At step S404, the loader magazine Z-axis motor is controlled in order to move the frame magazine 801 the predetermined distance in the Z direction (for example, 0.1 mm upward).

The actions at steps S902 to S905 are identical to those mentioned in FIG. 9 and FIG. 3. An iterative description will be omitted.

At step S906, if a decision is made based on a result of detection by the frame detection sensor that the frame 813 is absent (Yes), the procedure proceeds to step S405. If a decision is made that the frame 813 is present (No), the processing mentioned in FIG. 4 is terminated. The procedure proceeds to step S304 in FIG. 3.

At step S405, the parameter m is incremented by 1 (m=m+1).

At step S406, whether the parameter m takes on 1 is decided. If the parameter m takes on 1 (m=1), the procedure proceeds to step S402. If the parameter m takes on any value other than 1 (m≠1), the procedure proceeds to step S407.

At step S407, the parameter m is reset to zero, and the parameter n is incremented by 1 (m=0 and n=n+1).

At step S408, whether the parameter n falls below 5 or equal to or larger than 5 is decided. If the parameter n falls below 5 (n<5), the procedure proceeds to step S402. If the parameter n is equal to or larger than 5 (n≥5), the processing mentioned in FIG. 4 is terminated and the procedure proceeds to step S304 in FIG. 3.

Figure 5:
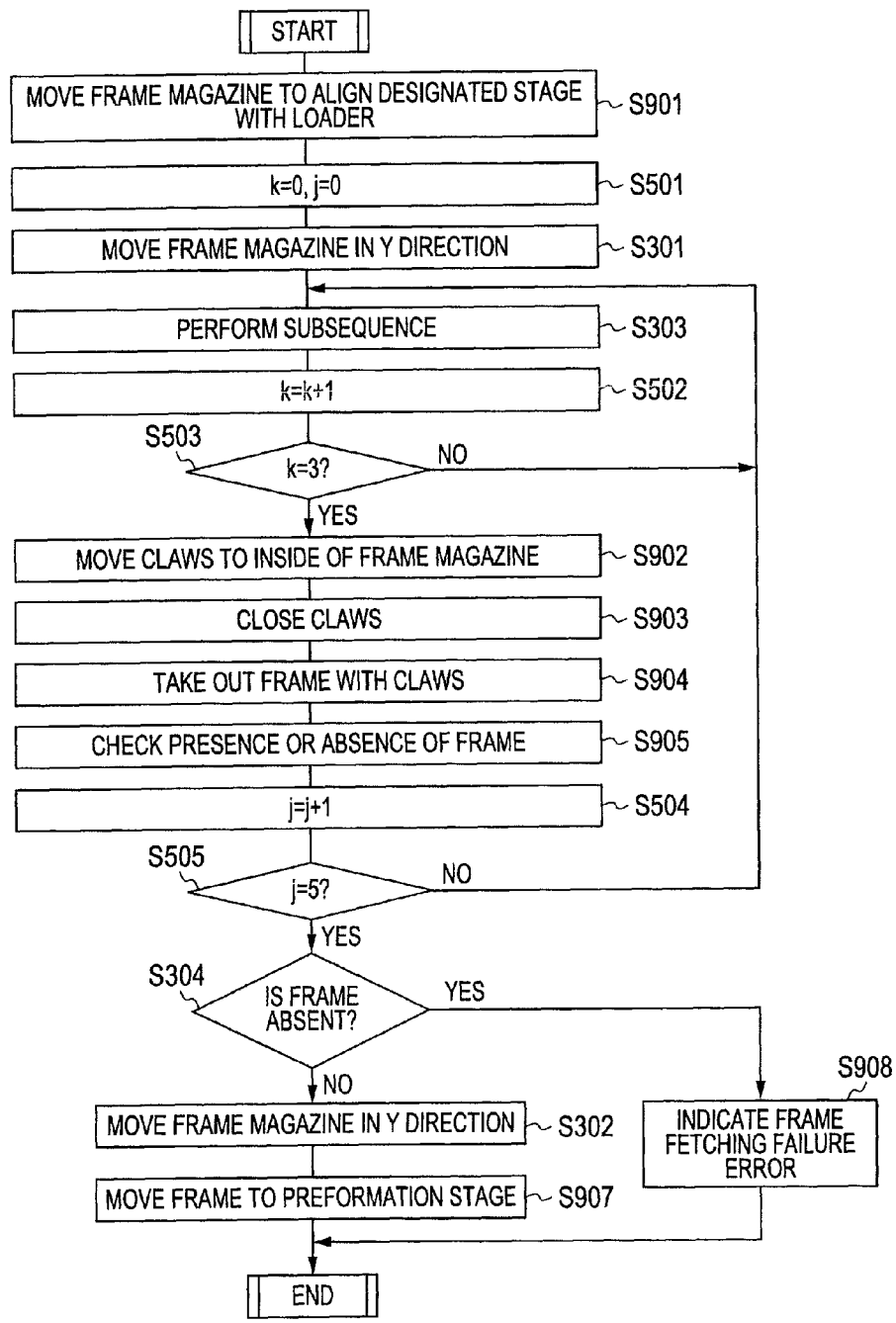
FIG. 5 is a flowchart for use in explaining an embodiment of an acting procedure in accordance with a frame feeding method of the present invention which is followed by the control unit of the die bonder.

Referring to FIG. 5 and FIG. 4, another embodiment of a frame feeding method in accordance with the present invention will be described below. FIG. 5 is a flowchart for use in explaining an example of an acting procedure in accordance with the frame feeding method of the present invention which is followed by the control unit of the die bonder.

In the embodiment described in conjunction with FIG. 3 and FIG. 4, the frame magazine 801 is once moved in the Y direction in order to oscillate a frame. Thereafter, the frame is taken out with the claws 812. The frame detection sensor detects presence or absence of the frame. If a decision is made that the frame is absent, the frame magazine is moved an n multiple of a predetermined distance in the Z direction. This subsequence is repeated a predetermined number of times in order to oscillate a frame. Thereafter, the frame is fetched.

In contrast, in the embodiment to be described in conjunction with FIG. 5 and FIG. 4, a movement in the Y direction and a movement in the Z direction are repeated a predetermined number of times. Thereafter, a frame is taken out with the claws 812. Thereafter, the frame detection sensor detects presence or absence of the frame 813. If a decision is made that the frame is absent, the frame magazine is re-moved in the Y direction and Z direction in order to oscillate the frame. The frame is then taken out.

A description will be made below in conjunction with FIG. 5 and FIG. 4.

In FIG. 5, at step S901, the loader magazine Z-axis motor is controlled in order to move the frame magazine 801 so that a designated stage of the frame magazine (for example, the frame storage chamber 803 on the uppermost stage) can be aligned with the loader feeder.

At step S501, parameters k and j are initialized to zeros (k=0 and j=0).

At step S301, processing is performed in the same manner as mentioned in FIG. 3. At step S303, processing is performed as mentioned in FIG. 4.

A step S502, the parameter k is incremented by 1 (k=k+1).

At step S503, whether the parameter k takes on 3 is decided. If the parameter takes on 3 (k=3), the procedure proceeds to step S902. If the parameter takes on any value other than 3 (k≠3), the procedure returns to step S303.

At steps S902 to S905, the same actions as those mentioned in FIG. 9 and FIG. 3 are carried out. An iterative description will be omitted.

At step S504, the parameter j is incremented by 1 (j=j+1).

At step S505, whether the parameter j takes on 5 is decided. If the parameter j takes on 5 (j=5), the procedure proceeds to step S304. If the parameter j takes on any value other than 3 (j≠5), the procedure returns to step S303.

At step S304, similarly to the step in FIG. 3, if a decision is made based on a result of detection by the frame detection sensor that the frame 813 is absent (Yes), the procedure proceeds to step S908. If a decision is made that the frame 813 is present (No), the procedure proceeds to step S302.

At steps S302, S907, and S908, the same actions as those mentioned in FIG. 3 are carried out. An iterative description will be omitted.

Figure 6:
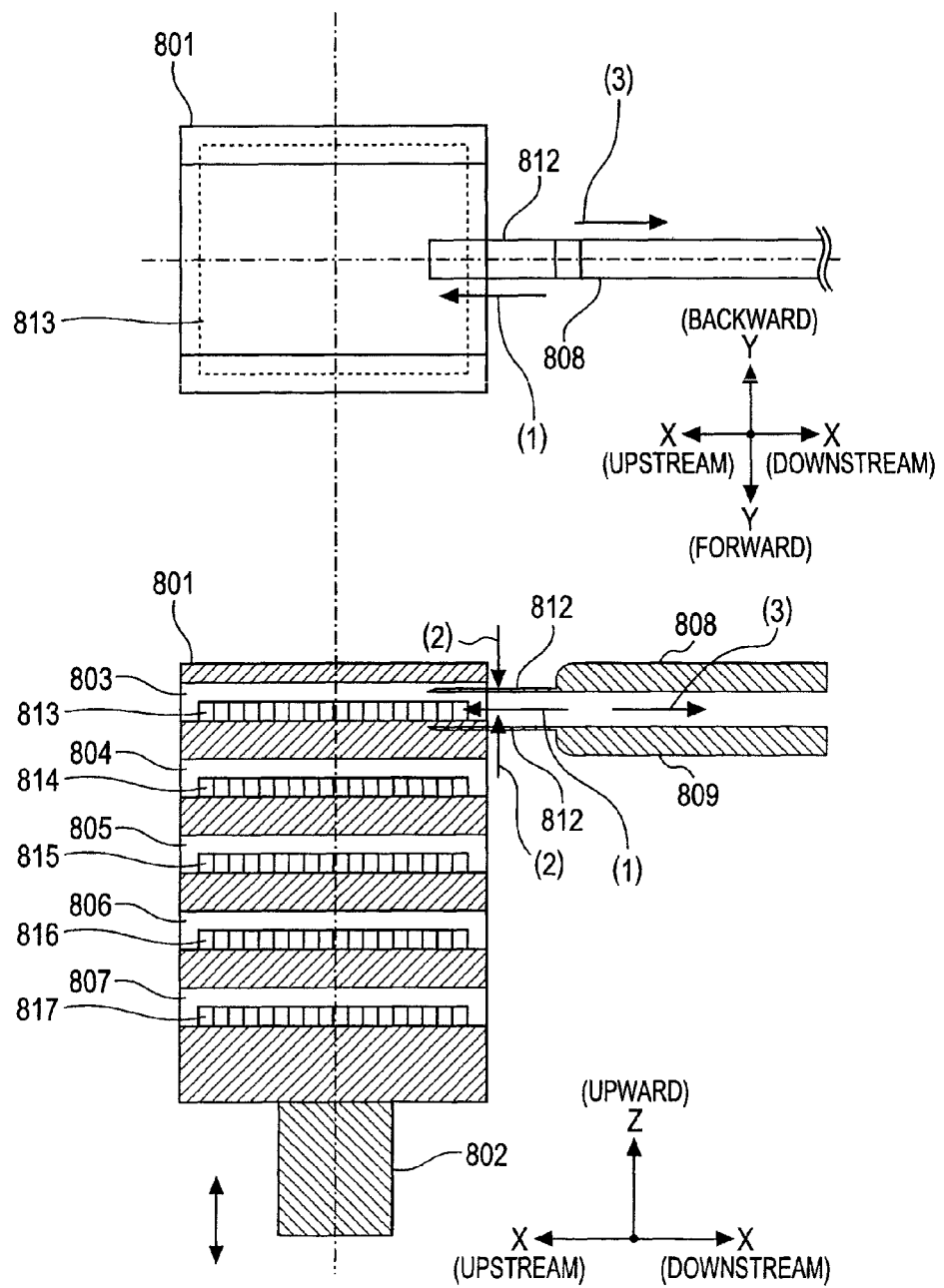
FIG. 6 is a diagram for use in explaining an embodiment of actions to be performed by a conventional frame feeding system.
Figure 7:
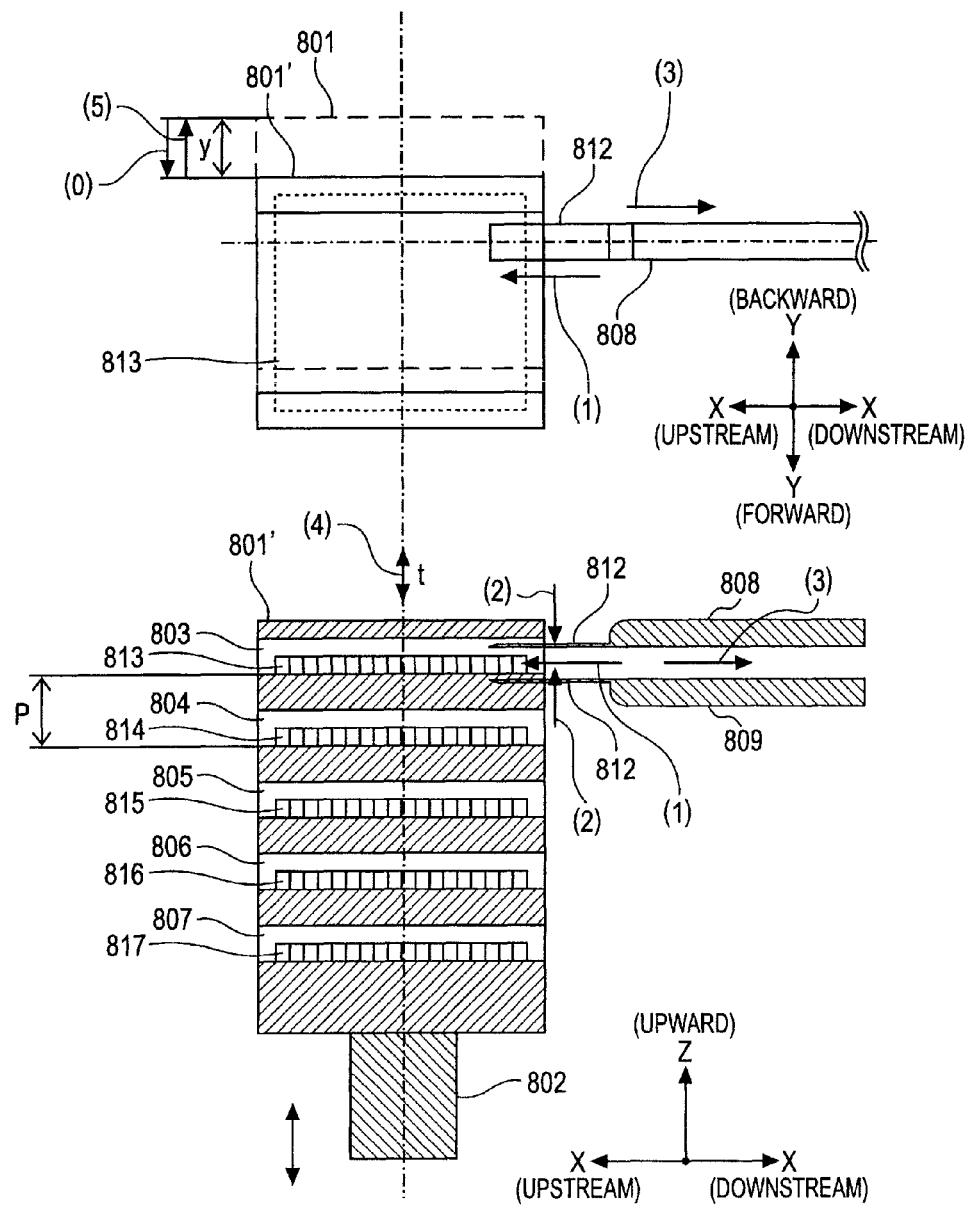
FIG. 7 is a diagram for use in explaining actions to be performed by an embodiment of a frame feeding system of the present invention.

Referring to FIG. 6 and FIG. 7, an embodiment of a frame feeding system in accordance with the present invention will be described below. FIG. 6 is a diagram for use in explaining an example of actions to be performed by a conventional frame feeding system. FIG. 7 is a diagram for use in explaining actions to be performed by the embodiment of the frame feeding apparatus in accordance with the present invention.

FIG. 6 shows the conventional frame feeding system. The upper part of FIG. 6 is a diagram in which the frame magazine 801, the upper part 808 of the loader feeder of the frame feeding system, and the claws 812 thereof are seen from above. The lower part of FIG. 6 is a diagram in which the frame magazine 801, the upper part 808 of the loader feeder of the frame feeding system, and the claws 812 thereof are seen sideways.

Referring to FIG. 6, a description will be made of actions the conventional frame feeding system performs to fetch the frame 813 from the frame magazine 801.

The loader lifter 802 has the capability to rise and fall with the aid of the loader magazine Z-axis motor 212 so as to move the frame magazine to a height at which the claws 812 of the loader feeder can clamp any of the frames 813 to 817 on a designated stage and take out the frame from the frame magazine 801.

First, the loader lifter 802 moves the frame magazine 801 so as to align a designated stage of the frame magazine (in FIG. 6, the frame storage chamber 803 on the uppermost stage) with the loader feeder.

Thereafter, the upper part 808 and lower part 809 of the loader feeder and the claws 812 thereof are moved in an arrow (1) direction (in an upstream X direction).

After the movement is made, the claws 812 are closed in arrow (2) directions in order to clamp the frame 813 stored in the frame storage chamber 803 of the frame magazine 801.

Thereafter, the upper part 808 and lower part 809 of the loader feeder and the claws 812 thereof are moved in an arrow (3) direction (in a downstream X direction).

Thereafter, the frame detection sensor 222 detects presence or absence of a frame.

Referring to FIG. 7, an example of actions which the frame feeding system of the present invention performs to fetch the frame 813 from the frame magazine 801 will be described with reference to the flowcharts of FIG. 3 and FIG. 4.

A loader lifter 802' has the capability to elevate or drive the frame magazine with the aid of the loader magazine Z-axis motor 212 so as to move the frame magazine to a height at which the claws 812 of the loader feeder can clamp any of the frames 813 to 817 on a designated stage and take out the frame from the frame magazine 801, and has the capability to rise or fall a predetermined distance t with the designated stage aligned with the loader feeder. The predetermined distance t is, for example, on the order of one-tenth of the loading pitch P between adjoining frame storage chambers, for example, a multiple of 0.1 mm. The loader lifter 802' has the capability to move a predetermined distance y in parallel with the aid of the loader magazine Y-axis motor 211 with the designated stage aligned with the loader feeder.

First, the loader lifter 802' moves the frame magazine 801 so as to align a designated stage of the frame magazine (in FIG. 7, the frame storage chamber 803 on the uppermost stage) with the loader lifter (dashed line in FIG. 7) (step S901).

Thereafter, the frame magazine 801 is moved the predetermined distance y in an arrow (0) direction. Preferably, the distance y is shorter than a distance from the center of the frame magazine to the projection (step S301).

The upper part 808 and lower part 809 of the loader feeder and the claws 812 thereof are moved in an arrow (1) direction (in an upstream X direction) (step S902).

After the movement is made, the claws 812 are closed in arrow (2) directions in order to clamp the frame 813 stored in the frame storage chamber 803 of the frame magazine 801 (step S903).

Thereafter, the upper part 808 and lower part 809 of the loader feeder and the claws 812 thereof are moved in an arrow (3) direction (in a downstream X direction) (step S904).

Thereafter, the frame detection sensor 222 detects presence or absence of a frame.

If the frame detection sensor 222 detects a frame, the main feeder carries the frame 813 to the work area, and moves the frame magazine 801 the predetermined distance y in an arrow (5) direction (step S905, step S906, step S302, and step S907).

If the frame is not detected, the frame magazine is raised and lowered the predetermined distance t (in arrow (4) directions) in order to oscillate the frame (step S303).

Thereafter, the upper part 808 and lower part 809 of the loader feeder and the claws 812 thereof are moved in the arrow (1) direction (in the upstream X direction) (step S902).

After the movement is made, the claws 812 are closed in the arrow (2) directions in order to clamp the frame 813 stored in the frame storage chamber 803 of the frame magazine 801 (step S903).

Thereafter, the upper part 808 and lower part 809 of the loader feeder and the claws 812 thereof are moved in the arrow (3) direction (in the downstream X direction) (step S904).

Thereafter, the frame detection sensor 22 detects presence or absence of a frame (step S905).

If the frame detection sensor 222 detects a frame, the main feeder carries the frame 813 to the work area, and moves the frame magazine 801 the predetermined distance y in the arrow (5) direction (step S907 and step S302).

In general, the frame magazine that accommodates frames has the sideways width (width in the Y directions) of the storage chambers thereof made larger than a permissible maximum width of frames in consideration of dimensional errors of frames to be stored. Further, since the claws may come into contact with one of the projections bearing the frame, the frame is designed so that the mount areas formed on the frame are not located on the edges of the frame in the Y directions.

Therefore, compared with when the claws are moved into the frame storage chamber in order to clamp a frame in the center in the Y directions of the frame, when the claws are moved into the frame storage chamber in order to clamp a frame on the edge of the frame, there is a little fear that the claws may come into contact with any of mount areas on the frame. Therefore, similarly to the embodiment, before the claws are moved into the frame storage chamber, the frame magazine is moved in the Y direction so that the claws can be inserted into the edge in the Y direction of the frame. As a result, a yield in manufacture of a mounting system such as a die bonding system or quality thereof can be improved. In addition, since occurrence of a fetching error diminishes, a throughput improves.

Further, since the frame magazine is moved in the Y direction, a frame is oscillated in a sideways direction. Therefore, the frame is likely to readily part from the frame magazine. Eventually, the frequency of a fetching error further diminishes and a throughput further improves.

Further, while the claws clamp and take out a frame, the frame detection sensor detects presence or absence of a frame. If the frame is not detected, the frame is slightly oscillated in the Z-axis directions once or several times. Thereafter, the frame is taken out. Thus, the frame can be reliably taken out. Therefore, the frequency of a fetching error further diminishes and a throughput further improves.

According to the embodiment, a frame feeding system and frame feeding method that do not cause a failure in frame fetching or a positional deviation of a fetched frame and that contribute to shortening of a lead time can be realized.

The embodiment of the frame feeding system may further include a frame pusher or a mechanism for pushing a frame out of the frame magazine.

In the embodiment, the number of frames to be stored in the frame magazine is five. However, the number of frames to be stored therein may be arbitrarily determined. Further, the number of mount areas to be formed on a frame may be arbitrarily determined.

Further, in the embodiment, the control unit of a component mounting system such as a die bonder also controls the frame feeding system. Alternatively, the component mounting system and frame feeding system may include mutually independent control units for the purpose of ensuring expandability, maintenance efficiency, or high-speed movability.

The present invention is utilized in a field of semiconductor fabrication having a process of fetching a frame from a frame magazine which accommodates frames, and adapted to, in addition to a die bonder, a wire bonder or a flip-chip bonder.

What is claimed is:

1. A frame feeding system comprising:
   a loader lifter including an elevating drive that elevates or drives a frame magazine, which accommodates frames, in Z directions;
   a loader feeder that fetches a frame from the frame magazine;
   a main feeder that carries the frame fetched by the loader feeder to a work area; and
   a control unit that controls the loader lifter, loader feeder, and main feeder, wherein
   the loader lifter further includes a first moving mechanism that moves the frame magazine a predetermined first distance in Y directions;
   the control unit controls the first moving mechanism of the loader lifter so as to move the frame magazine the first distance in the Y direction;
   the control unit then controls the loader feeder so as to clamp a frame with claws of the loader feeder and take out the frame;
   the control unit then controls the main feeder so as to carry the frame to the work area;
   the loader lifter further includes a second moving mechanism that moves the frame magazine a predetermined second distance up and down in the Z directions;
   the control unit includes a frame detection instrument that detects presence or absence of a frame clamped with the claws of the loader feeder;
   after the control unit controls the loader feeder so as to clamp the frame with the claws of the loader feeder, the frame detection instrument detects presence or absence of the frame;
   if the frame is not detected, the control unit controls the second moving mechanism of the loader lifter so as to move the frame magazine the second distance up and down in the Z directions; and
   the control unit then controls the loader feeder so as to clamp the frame with the claws of the loader feeder and take out the frame.

2. The frame feeding system according to claim 1, wherein the second moving mechanism repeats the up-and-down movement of the second distance a plurality of times.

3. A frame feeding system comprising:
   a loader lifter including an elevating drive that elevates or drives a frame magazine, which accommodates frames, in Z directions;
   a loader feeder that fetches a frame from the frame magazine;
   a main feeder that carries the frame fetched by the loader feeder to a work area; and
   a control unit that controls the loader lifter, loader feeder, and main feeder; and
   a frame detection instrument that detects presence or absence of a frame clamped with the claws of the loader feeder;
   the loader lifter further includes a first moving mechanism that moves the frame magazine a predetermined first distance in Y directions, and a second moving mechanism that moves the frame magazine a predetermined second distance up and down in the Z directions;
   the control unit controls the first moving mechanism of the loader lifter so as to move the frame magazine the first distance in the Y direction;
   the control unit then controls the second moving mechanism of the loader lifter so as to move the frame magazine the second distance up and down in the Z directions; and
   the control unit then controls the loader feeder so as to clamp a frame with claws of the loader feeder and take out the frame, and if the frame is not detected, the control unit controls the second moving mechanism of the loader lifter so as to move the frame magazine the second distance up and down in the Z directions; and
   the control unit then controls the loader feeder so as to clamp the frame with the claws of the loader feeder and take out the frame.

4. The frame feeding system according to claim 3, wherein the second moving mechanism repeats the up-and-down movement of the second distance a plurality of times.

5. A frame feeding method for a frame feeding system, which includes a loader lifter having an elevating drive that elevates or drives a frame magazine, which accommodates frames, in Z directions, a loader feeder that fetches a frame from the frame magazine, and a control unit that controls the loader lifter and loader feeder, and includes a frame detection instrument that detects presence or absence of a frame clamped with the claws of the loader feeder, comprising the steps of:

moving the frame magazine a predetermined first distance in a Y direction;

clamping a frame with claws of the loader feeder;

taking out the frame;

detecting presence or absence of the frame within the claws of the loader feeder after moving the frame magazine the first distance;

if the frame is not detected at the step of detecting presence or absence of the frame, moving the frame magazine a predetermined second distance up and down in the Z directions; and taking out the frame.

6. The frame feeding method according to claim 5, wherein at the step of moving the frame magazine the second distance, the up-and-down movement is repeated a plurality of times.

7. A frame feeding method for a frame feeding system, which includes a loader lifter having an elevating drive that elevates or drives a frame magazine, which accommodates frames, in Z directions, a loader feeder that fetches a frame from the frame magazine, and a control unit that controls the loader lifter and loader feeder, and includes a frame detection instrument that detects presence or absence of a frame clamped with the claws of the loader feeder, comprising:

moving the frame magazine a predetermined first distance in a Y direction;

moving the frame magazine a predetermined second distance up and down in the Z directions;

clamping a frame with claws of the loader feeder;

taking out the frame;

detecting presence or absence of the frame within the claws of the loader feeder;

if the frame is not detected, moving the frame magazine the predetermined second distance up and down in the Z directions, and clamping a frame with the claws of the loader feeder; and taking out the frame.

8. The frame feeding method according to claim 7, wherein at the step of moving the frame magazine the second distance, the up-and-down movement is repeated a plurality of times.

\* \* \* \* \*